United States Patent
Li et al.

(10) Patent No.: US 7,098,101 B1
(45) Date of Patent: Aug. 29, 2006

(54) METHOD OF FORMING $Pr_xCa_{1-x}MnO_3$ THIN FILMS HAVING A $PRMNO_3/CAMNO_3$ SUPER LATTICE STRUCTURE USING METALORGANIC CHEMICAL VAPOR DEPOSITION

(75) Inventors: Tingkai Li, Vancouver, WA (US);
Lawrence J. Charneski, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/297,242

(22) Filed: Dec. 7, 2005

(51) Int. Cl.
*H01L 21/8234* (2006.01)
(52) U.S. Cl. .................. 438/238; 438/384; 438/385
(58) Field of Classification Search .................. 438/3, 438/238–256, 381–396, 761–763
See application file for complete search history.

(56) References Cited

U.S. PATENT DOCUMENTS 6,939,724 B1  9/2005  Zhuang et al.

2004/0159867 A1*  8/2004  Kinney et al. ............... 257/295

OTHER PUBLICATIONS

U.S. Appl. No. 10/831,677, filed Apr. 23, 2004, Zhuang et al.
U.S. Appl. No. 10/836,689, filed Apr. 30, 2004, Li et al.

* cited by examiner

*Primary Examiner*—H. Jey Tsai
(74) *Attorney, Agent, or Firm*—Robert D. Varitz, PC

(57) ABSTRACT

A method of forming $Pr_xCa_{1-x}MnO_3$ thin films having a PMO/CMO super lattice structure using metalorganic chemical vapor deposition includes preparing organometallic compounds and solvents and mixing organometallic compounds and solvents to form PMO and CMO precursors. The precursors for PMO and CMO are injected into a MOCVD chamber vaporizer. Deposition parameters are selected to form a nano-sized PCMO thin film or a crystalline PCMO thin film from the injection of PMO and CMO precursors, wherein the PMO and CMO precursors are alternately injected into the MOCVD chamber vaporizer. The selected deposition parameters are maintained to deposit the PCMO thin film species having a desired Pr:Ca concentration ratio in a specific portion of the PCMO thin film. The resultant PCMO thin film is annealed at a selected temperature for a selected time period.

18 Claims, 3 Drawing Sheets

METHOD OF FORMING $Pr_xCa_{1-x}MnO_3$ THIN FILMS HAVING A $PrMnO_3/CaMnO_3$ SUPER LATTICE STRUCTURE USING METALORGANIC CHEMICAL VAPOR DEPOSITION

FIELD OF THE INVENTION

This invention relates to processes and fabrication of Resistive Random Access Memory devices (RRAM), and specifically to a method to deposit $Pr_xCa_{1-x}MnO_3$ thin film materials having a multi-layer, or super lattice, structure of $PrMnO_3$ (PMO)/$CaMnO_3$ (CMO) for RRAM applications using MOCVD techniques.

BACKGROUND OF THE INVENTION

Perovskite materials, such as $Pr_{1-x}Ca_xMnO_3$ (PCMO) demonstrate reversible resistive switching properties, which may be used for low power, low operating voltage, high speed and high density memory applications. When a PCMO film is deposited on a platinum substrate, nano-meter sized PCMO materials exhibit mono-polar switching properties, and crystallized PCMO materials exhibit bipolar switching properties. However, when a PCMO film is fairly uniformly crystallized the high/low ($R_H/R_L$) bipolar switching ratio is very low. An asymmetric material is required for high speed bipolar switching application. Although oxygen density distribution and device geometry manipulation are able to achieve good bipolar switching property for larger devices, these processes are difficult to scale down to very small memory cell size.

The resistance of a perfectly uniform Electric Pulse-Induced Resistance (EPIR) variation material memory resistor can only be programmed by using a narrow electrical pulse to set the resistance to a high resistance state, $R_H$, and using a wide electrical pulse to reset the resistance to a low resistance state, $R_L$. Various methods, such as tailoring crystalline structure, oxygen content distribution, and device geometry design, have been proposed to achieve these goals. A large difference in crystalline structure is required, which is difficult to scale to a very thin film application for use in very small size memory devices. The oxygen content distribution requires a higher oxygen content at the upper portion of the memory thin film. This may be achieved easily by an annealing process, however, because oxygen is mobile in RRAM material, such as PCMO, reliability issues arise when the temperature of the device is raised, either during device fabrication processes or during circuit operation.

U.S. patent application Ser. No. 10/831,677, filed Apr. 23, 2004, of Zhuang et al., entitled PCMO Thin Film with Memory Resistance Properties, describes basic fabrication of a PCMO thin film.

U.S. Pat. No. 6,939,724 B1, granted Feb. 17, 2005, to Zhuang et al., entitled Method for Obtaining Reversible Resistance Switches on the PCMO Thin Film Integrated with a Highly Crystallized Seed Layer, describes use of a seed layer of highly crystallized PCMO, which is deposited by MOCVD. A second PCMO thin film is deposited by spin-coating on the seed layer, which produces a polycrystalline layer, wherein the second PCMO layer is ten times thicker than the seed layer. The two step PCMO deposition process allows formation of a combined PCMO layer which has a higher resistance potential than does the PCMO layers of the known prior art.

U.S. patent application Ser. No. 10/836,689, filed Apr. 30, 2004, of Li et al., entitled PCMO Thin Film with Resistance Random Access Memory (RRAM) Characteristics, describes PCMO thin films having predetermined memory-resistance characteristics and describes fabrication processes. The method includes forming a $Pr^{3+}_{1-x}Ca^{2+}_xMnO$ thin film composition, where $0.1<x<0.6$, and where the ratio of Mn and O ions are varied as follows: $O^{2-}(3\pm20\%)$; $Mn^{3+}((1-x)\pm20\%)$; and, $Mn^{4+}(x\pm20\%)$. When the PCMO thin film has a $Pr^{3+}_{0.70}Ca^{2+}_{0.30}Mn^{3+}_{0.78}Mn^{4+}_{0.22}O^{2-}_{2.96}$ composition, the ratio of Mn and O ions varies as follows: $O^{2-}(2.96)$; $Mn^{3+}((1-x)+8\%)$; and, $Mn^{4+}(x-8\%)$.

SUMMARY OF THE INVENTION

A method of forming $Pr_xCa_{1-x}MnO_3$ thin films having a PMO/CMO super lattice structure using metalorganic chemical vapor deposition includes preparing organometallic compounds and solvents and mixing organometallic compounds and solvents to form PMO and CMO precursors. The precursors for PMO and CMO are injected into a MOCVD chamber vaporizer. Deposition parameters are selected to form a nano-sized PCMO thin film or a crystalline PCMO thin film from the injection of PMO and CMO precursors, wherein the PMO and CMO precursors are alternately injected into the MOCVD chamber vaporizer. The selected deposition parameters are maintained to deposit the PCMO thin film species. The resultant PCMO thin film is annealed at a selected temperature for a selected time period.

It is an object of the invention to provide a $PrMnO_3$ (PMO)/$CaMnO_3$ (CMO) multi-layer structure to control calcium content in a $Pr_{1-x}Ca_xMnO_3$ (PCMO) thin film which is used in switching applications.

Another object of the invention is to provided an RRAM having a calcium concentration in a PCMO layer to provided a bipolar or monopolor switching property.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
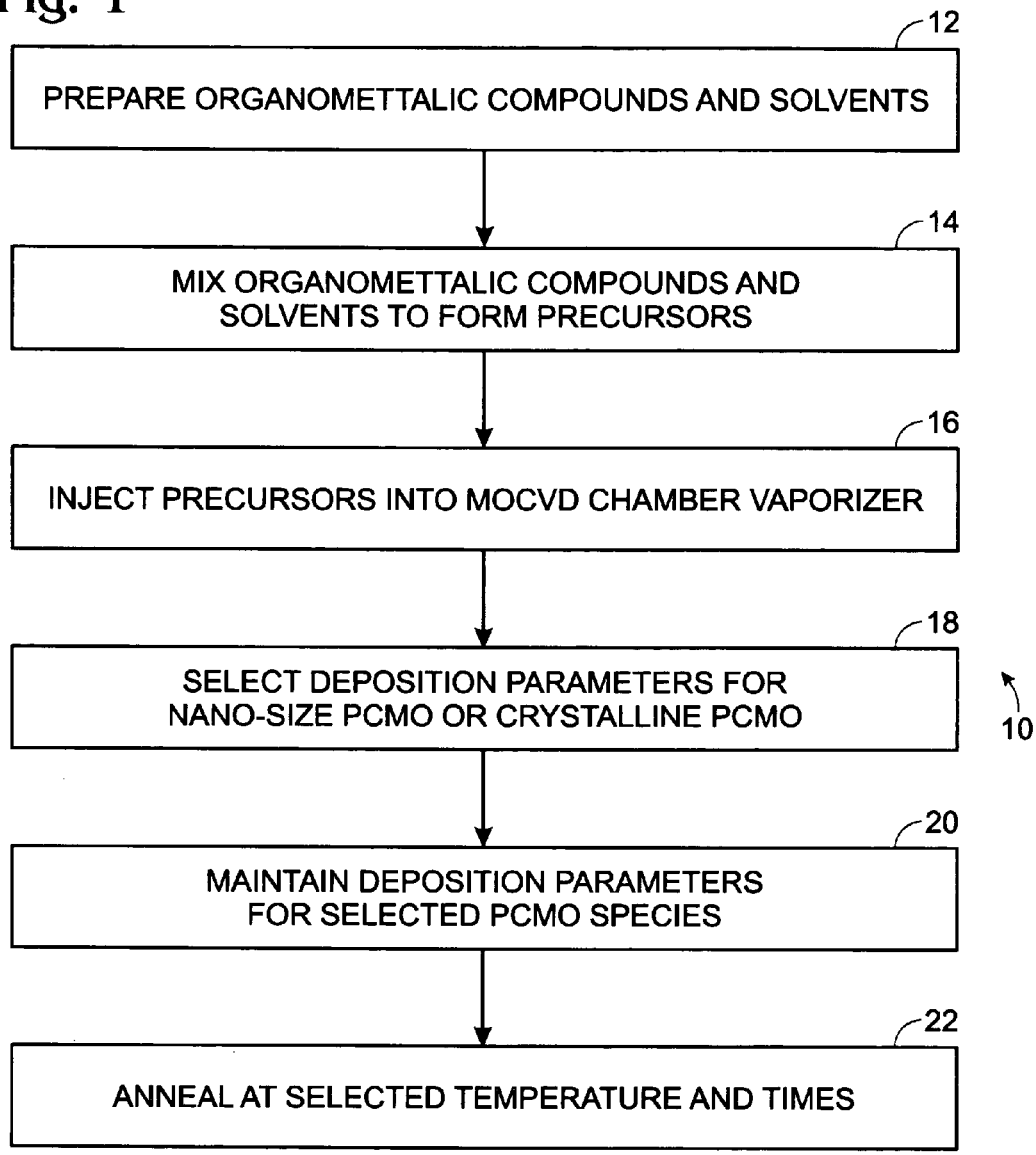
FIG. 1 is a block diagram depicting the method of the invention.

This disclosure describes use of a $PrMnO_3$ (PMO)/$CaMnO_3$ (CMO) multi-layer structure to control calcium content in a $Pr_{1-x}Ca_xMnO_3$ (PCMO) thin film used in a switching applications, which may be bipolar or monopolar. The resistance of a perfectly uniform electric pulse-induced resistance variation (EPIR) material memory resistor can only be programmed using a narrow electrical pulse to set the resistance to a high resistance state, $R_H$, and using a wide electrical pulse to reset the resistance to a low resistance state, $R_L$.

As previously noted, control of oxygen content of a PCMO thin film has been used to control switching properties therein, however, as oxygen tends to be somewhat unstable in a PCMO thin film, control of switching properties by controlling oxygen is not as effective as one would desire. The calcium content of a PCMO thin film memory resistor determines programming properties of a memory resistor containing the PCMO thin film. When the Ca/Pr ratio is either higher than 0.6, or lower than 0.1, no switching property is exhibited. Thus, a "low" Ca:Pr concentration ratio is equal to or higher than 0.1; and a "high" Ca:Pr concentration ratio is equal to or less than 0.6. In addition, calcium is not mobile and is stable even at relatively high temperatures.

The method of the invention is a technique for fabricating an asymmetric resistor memory, having controlled calcium content by selectively forming nano-sized PCMO thin film or a crystalline PCMO thin film, for use in asymmetric resistor memory application. As the resultant thin film may be either nano-crystalline or may have a fairly good crystalline structure, the thin film maintains a calcium-rich or calcium-poor concentration at the portion of resistor material which is either near the bottom electrode or near the top electrode.

For instance, if the first deposited layer is PMO, the PCMO material near the bottom electrode will be calcium-poor, while, if the first deposited layer is CMO, the PCMO material near the bottom electrode will be calcium-rich. For crystalline PCMO thin films, if the PCMO material near the bottom electrode is calcium-poor, and top electrode is calcium rich, the resultant RRAM will have bipolar switching properties; for nano-sized PCMO materials, if the PCMO material near both the bottom and top electrode is calcium-rich or calcium-poor, the resultant RRAM will have monopolar switching properties. Otherwise, the PCMO thin films will have both bipolar and monopolar switching properties, but the ratios of high resistance to low resistance will be smaller. Whether the multi-layer of PMO/CMO thin film fabricated according to the method of the invention is either nano-crystalline or crystalline PCMO, is determined by a post-deposition heat treatment. Therefore, the method of the invention may be tailored to thin film formation which is suitable for use in RRAM memory devices, providing a PCMO thin film species having a desired Pr:Ca concentration ratio in a specific portion of the PCMO thin film.

The following examples describe two processes, FIG. 1, generally at 10, for depositing a $Pr_{1-x}Ca_xMnO_3$ thin film having multi-layer PMO/CMO and a super lattice of PMO/CMO by using liquid delivery MOCVD techniques. The precursors are solid organometallic compounds: $Pr(thd)_3Ca(thd)_2$, and $Mn(thd)_3$, where thd is $C_{11}H_{19}O_2$. The organic solvents are butylether and tetraglyme. The substrates are Pt/(Ti or TiN or TaN)/SiO$_2$/Si and Ir/(Ti or TiN or TaN)/SiO$_2$/Si. The organometallic compounds and solvents are prepared, 12, and mixed 14, to form the requisite PMO and CMO precursors.

Using $Pr(thd)_3Ca(thd)_2$, $Mn(thd)_3$, precursors of $PMO_{0.5}O$ and $CM_{0.5}O$ solutions are made, having a molar ratio of about (1:0.5) of Pr:Mn and (1:0.5) of Ca:Mn, dissolved in a mixed solvent of butyl ether and tetraglyme in a volume ratio of 3:1. The precursor solutions have a concentration of 0.1 M/L of metals in PMO and CMO. The solutions were injected 16, alternately, into a MOCVD chamber vaporizer at temperature in a range of between about 240° C. to 280° C., by a liquid flow meter, at a rate of between about 0.2 ml/min to 0.4 ml/min to form precursor vapors in a MOCVD chamber. The feed line is maintained at a temperature of between about 250° C. to 280° C. Two MOCVD processes are available, and may be selected 18, to form either a nano-sized PCMO thin film, or a crystallized PCMO thin film, as follows:

Precursor solutions of PMO and CMO are injected, alternately into a MOCVD chamber vaporizer to deposit a $Pr_{1-x}Ca_xMnO_3$ thin film. The characteristics of the deposited thin film is dependent on the delivery time of each precursor. The following deposition parameters are maintained 20, to from the selected PCMO thin film:

TABLE 1

| | Process One: Nano-Sized PCMO Thin Film | Process Two: Crystallized PCMO Thin Film |
|---|---|---|
| Deposition Temperature | 350° C. to 420° C. | 420° C. to 550° C. |
| Deposition Pressure | 1 torr to 5 torr | 1 torr to 5 torr |
| Oxygen Partial Pressure | 20% to 30% | 20% to 30% |
| Vaporizer Temperature | 200° C. to 240° C. | 200° C. to 240° C. |
| Solution Delivery Rate | 0.1 ml/min to 0.5 ml/min | 0.1 ml/min to 0.5 ml/min |
| Deposition Time | 1 minute to 30 minutes | 1 minute to 30 minutes |
| Annealing | 525° C. for 30 minutes | 600° C. for 30 minutes |

The deposition time is dependent on the requirement of film thickness.

Figure 2:
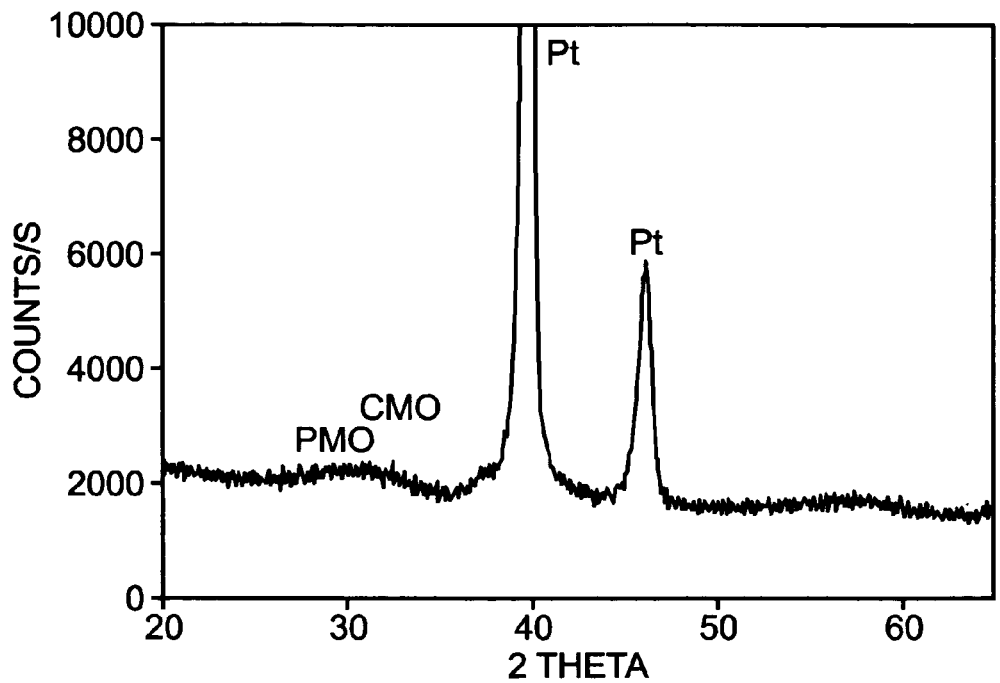
FIG. 2 depicts an x-ray pattern of an as-deposited PCMO thin film, deposited at a temperature of about 410° C.
Figure 3:
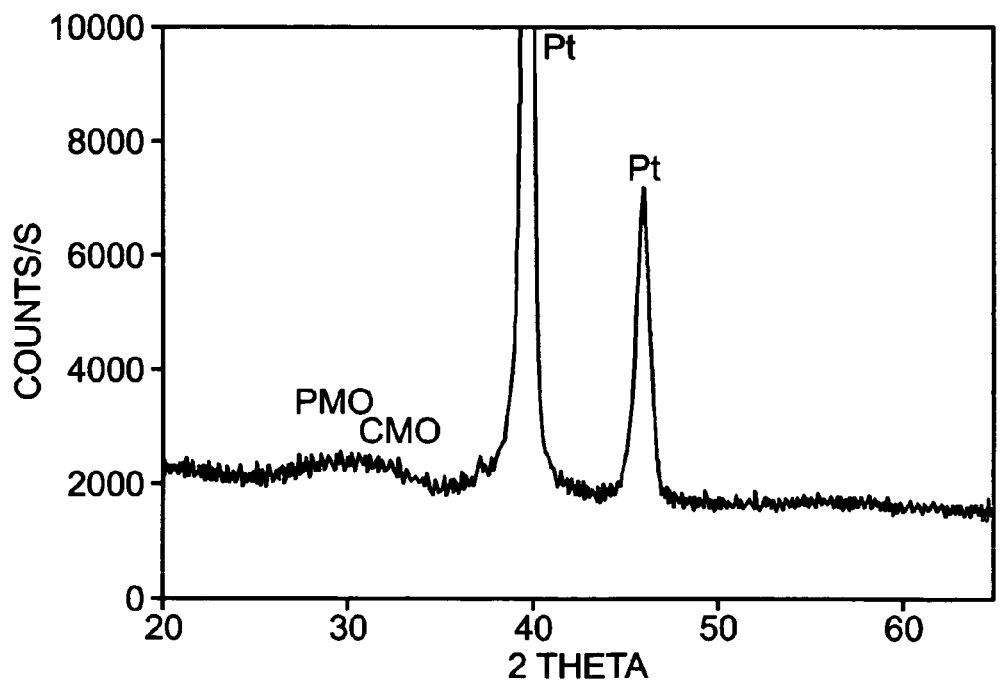
FIG. 3 depicts an x-ray pattern of the PCMO thin film of FIG. 2 after annealing at about 525° C. for about 30 minutes.
Figure 4:
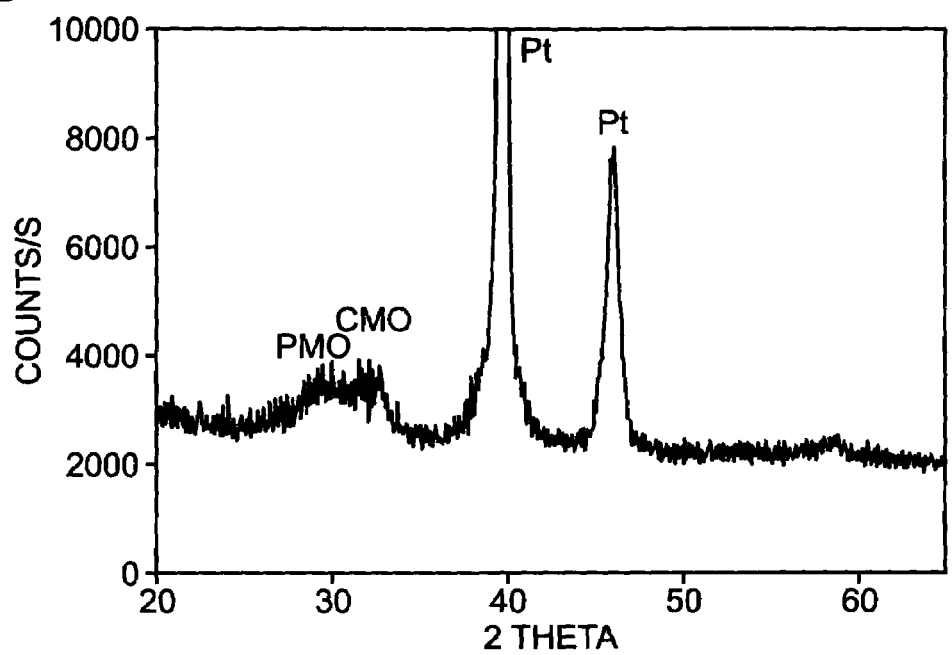
FIG. 4 depicts an x-ray pattern of an as-deposited PCMO thin film, deposited at a temperature of about 450° C.
Figure 5:
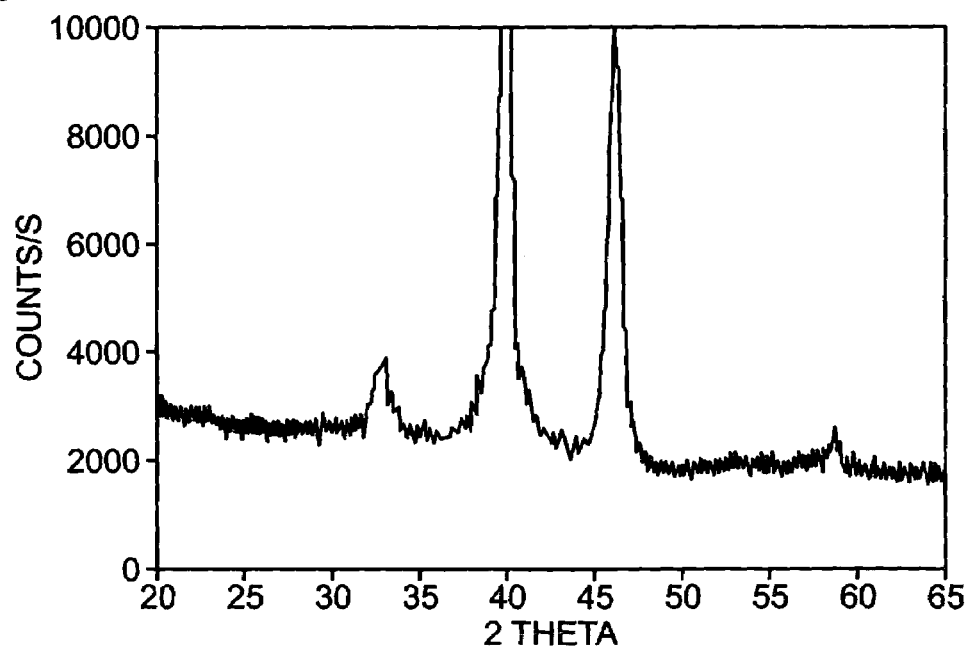
FIG. 5 depicts an x-ray pattern of the PCMO thin film of FIG. 4 after annealing at about 600° C. for about 30 minutes.

FIGS. 2 and 3 depicts x-ray patterns of an as-deposited, and after a 525° C. anneal for 30 minutes, PCMO thin film formed by PMO/CMO precursors, respectively, according to the method of the invention, The as-deposited PCMO thin films are nearly amorphous. After post-annealing at 525° C. for half hour, The PCMO thin films are still nearly amorphous. FIGS. 4 and 5 depict x-ray patterns of PMO/CMO deposited PCMO thin films. An as-deposited PCMO thin films exhibits the small peaks of PMO and CMO materials, as shown in FIG. 5. After post-annealing at 600° C. for half hour, the peak of PCMO thin films appears, as depicted in FIG. 6. Based on these two sets of data it is clear that various crystalline structure, varying from nano-crystalline to fully crystallized PCMO thin film may be deposited using PMO/CMO multi-layer deposition with various post deposition annealing. The local film composition may be varied through the control of the thickness of the PMO and CMO layers.

Thus, a method of forming $Pr_xCa_{1-x}MnO_3$ thin films having a $PrMnO_3/CaMnO_3$ super lattice structure using metalorganic chemical vapor deposition has been disclosed. It will be appreciated that further variations and modifications thereof may be made within the scope of the invention as defined in the appended claims.

We claim:

1. A a method of forming $Pr_xCa_{1-x}MnO_3$ thin films having a PMO/CMO super lattice structure using metalorganic chemical vapor deposition, comprising:

preparing organometallic compounds and solvents;

mixing organometallic compounds and solvents to form PMO and CMO precursors;

injecting the precursors for PMO and CMO into a MOCVD chamber vaporizer;

selecting deposition parameters to form a nano-sized PCMO thin film or a crystalline PCMO thin film from the injection of PMO and CMO precursors, wherein the PMO and CMO precursors are alternately injected into the MOCVD chamber vaporizer;

maintaining the selected deposition parameters to deposit the PCMO thin film species having a desired Pr:Ca concentration ratio in a specific portion of the PCMO thin film; and annealing the PCMO thin film at a selected temperature for a selected time period.

2. The method of claim 1 wherein said preparing organometallic compounds includes preparing $Pr(thd)_3Ca(thd)_2$, and $Mn(thd)_3$, where thd is $C_{11}H_{19}O_2$.

3. The method of claim 1 wherein said preparing solvents includes preparing organic solvents of butylether and tetraglyme.

4. The method of claim 1 wherein said mixing includes mixing $Pr(thd)_3Ca(thd)_2$, $Mn(thd)_3$, in a mixed solvent of butyl ether and tetraglyme in a volume ratio of 3:1, thus forming precursors for PMO and CMO having a molar ratio of about (1:0.5) of Pr:Mn and (1:0.5) of Ca:Mn, respectively.

5. The method of claim 1 wherein said injecting includes injecting the PMO and CMO precursors, alternately into a MOCVD chamber vaporizer at a temperature in a range of between about 240° C. to 280° C., by a liquid flow meter, at a rate of between about 0.2 ml/min to 0.4 ml/min, and maintaining a feed line of the MOCVD chamber at a temperature of between about 250° C. to 280° C.

6. The method of claim 1 wherein said maintaining the selected deposition parameters to deposit the PCMO thin film species includes maintaining the deposition parameters according to the following table:

|  | Process One: Nano-Sized PCMO Thin Film | Process Two: Crystallized PCMO Thin Film |
| --- | --- | --- |
| Deposition Temperature | 350° C. to 420° C. | 420° C. to 550° C. |
| Deposition Pressure | 1 torr to 5 torr | 1 torr to 5 torr |
| Oxygen Partial Pressure | 20% to 30% | 20% to 30% |
| Vaporizer Temperature | 200° C. to 240° C. | 200° C. to 240° C. |
| Solution Delivery Rate | 0.1 ml/min to 0.5 ml/min | 0.1 ml/min to 0.5 ml/min |
| Deposition Time | 1 minute to 30 minutes | 1 minute to 30 minutes |
| Annealing | 525° C. for 30 minutes | 600° C. for 30 minutes. |

7. The method of claim 1 which includes injecting PMO as the first precursor into the MOCVD chamber to provide a PCMO thin film having a calcium-poor concentration at the bottom of the PCMO layer to form an RRAM having bipolar switching properties and alternately injecting CMO as the first precursor into the MOCVD chamber to provide a calcium-rich concentration at the bottom and top of the PCMO layer to form an RRAM having mono-polar swtiching properties.

8. A a method of forming $Pr_XCa_{1-X}MnO_3$ thin films having a PMO/CMO super lattice structure using metalorganic chemical vapor deposition, comprising:

preparing organometallic compounds and solvents, including preparing $Pr(thd)_3Ca(thd)_2$, and $Mn(thd)_3$, where thd is $C_{11}H_{19}O_2$, and preparing organic solvents of butylether and tetraglyme, mixing organometallic compounds and solvents to form PMO and CMO precursors;

injecting the precursors for PMO and CMO into a MOCVD chamber vaporizer;

selecting deposition parameters to form a nano-sized PCMO thin film or a crystalline PCMO thin film from the injection of PMO and CMO precursors, wherein the PMO and CMO precursors are alternately injected into the MOCVD chamber vaporizer;

maintaining the selected deposition parameters to deposit the PCMO thin film species having a desired Pr:Ca concentration ratio in a specific portion of the PCMO thin film; and annealing the PCMO thin film at a selected temperature for a selected time period.

9. The method of claim 8 herein said mixing includes mixing $Pr(thd)_3Ca(thd)_2$, $Mn(thd)_3$, in a mixed solvent of butyl ether and tetraglyme in a volume ratio of 3:1, thus forming precursors for PMO and CMO having a molar ratio of about (1:0.5) of Pr:Mn and (1:0.5) of Ca:Mn, respectively.

10. The method of claim 8 wherein said injecting includes injecting the PMO and CMO precursors, alternatively into a MOCVD chamber vaporizer at a temperature in a range of between about 240° C. to 280° C., by a liquid flow meter, at a rate of between about 0.2 ml/min to 0.4 ml/min, and maintaining a feed line of the MOCVD chamber at a temperature of between about 250° C. to 280° C.

11. The method of claim 8 wherein said maintaining the selected deposition parameters to deposit the PCMO thin film species maintaining the deposition parameters according to the following table:

|  | Process One: Nano-Sized PCMO Thin Film | Process Two: Crystallized PCMO Thin Film |
| --- | --- | --- |
| Deposition Temperature | 350° C. to 420° C. | 420° C. to 550° C. |
| Deposition Pressure | 1 torr to 5 torr | 1 torr to 5 torr |
| Oxygen Partial Pressure | 20% to 30% | 20% to 30% |
| Vaporizer Temperature | 200° C. to 240° C. | 200° C. to 240° C. |
| Solution Delivery Rate | 0.1 ml/min to 0.5 ml/min | 0.1 ml/min to 0.5 ml/min |
| Deposition Time | 1 minute to 30 minutes | 1 minute to 30 minutes |
| Annealing | 525° C. for 30 minutes | 600° C. for 30 minutes. |

12. The method of claim 8 which includes injecting PMO as the first precursor into the MOCVD chamber to provide a PCMO thin film having a calcium-poor concentration at the bottom of the PCMO layer to form an RRAM having bipolar switching properties and alternately injecting CMO as the first precursor into the MOCVD chamber to provide a calcium-rich concentration at the bottom and top of the PCMO layer to form an RRAM having monopolar swtiching properties.

13. A a method of forming $Pr_XCa_{1-X}MnO_3$ thin films having a PMO/CMO super lattice structure using metalorganic chemical vapor deposition, comprising:

preparing organometallic compounds and solvents;

mixing organometallic compounds and solvents to form PMO and CMO precursors;

injecting the precursors for PMO and CMO into a MOCVD chamber vaporizer;

selecting deposition parameters to form a nano-sized PCMO thin film or a crystalline PCMO thin film from the injection of PMO and CMO precursors, wherein the PMO and CMO precursors are alternately injected into the MOCVD chamber vaporizer;

maintaining the selected deposition parameters to deposit the PCMO thin film species having a desired Pr:Ca concentration ratio in a specific portion of the PCMO thin film according to the following table:

|  | Process One: Nano-Sized PCMO Thin Film | Process Two: Crystallized PCMO Thin Film |
| --- | --- | --- |
| Deposition Temperature | 350° C. to 420° C. | 420° C. to 550° C. |
| Deposition Pressure | 1 torr to 5 torr | 1 torr to 5 torr |
| Oxygen Partial Pressure | 20% to 30% | 20% to 30% |
| Vaporizer Temperature | 200° C. to 240° C. | 200° C. to 240° C. |
| Solution Delivery Rate | 0.1 ml/min to 0.5 ml/min | 0.1 ml/min to 0.5 ml/min |
| Deposition Time | 1 minute to 30 minutes | 1 minute to 30 minutes |
| Annealing | 525° C. for 30 minutes | 600° C. for 30 minutes. |

14. The method of claim 13 wherein said preparing organometallic compounds includes preparing $Pr(thd)_3 Ca(thd)_2$, and $Mn(thd)_3$, where thd is $C_{11}H_{19}O_2$.

15. The method of claim 13 wherein said preparing solvents includes preparing organic solvents of butylether and tetraglyme.

16. The method of claim 13 wherein said mixing includes mixing $Pr(thd)_3 Ca(thd)_2$, $Mn(thd)_3$, in a mixed solvent of butyl ether and tetraglyme in a volume ratio of 3:1, thus forming precursors for PMO and CMO having a molar ratio of about (1:0.5) of Pr:Mn and (1:0.5) of Ca:Mn, respectively.

17. The method of claim 13 wherein said injecting includes injecting the PMO and CMO precursors, alternately into a MOCVD chamber vaporizer at a temperature in a range of between about 240° C. to 280° C., by a liquid flow meter, at a rate of between about 0.2 ml/min to 0.4 ml/min, and maintaining a feed line of the MOCVD chamber at a temperature of between about 250° C. to 280° C.

18. The method of claim 13 which includes injecting PMO as the first precursor into the MOCVD chamber to provide a PCMO thin film having a calcium-poor concentration at the bottom of the PCMO layer to form an RRAM having bipolar switching properties and alternately injecting CMO as the first precursor into the MOCVD chamber to provide a calcium-rich concentration at the bottom and top of the PCMO layer to form an RRAM having monopolar swtiching properties.

* * * * *